US007239070B2

(12) United States Patent
Shimada et al.

(10) Patent No.: US 7,239,070 B2
(45) Date of Patent: Jul. 3, 2007

(54) LIQUID-JET HEAD AND LIQUID-JET APPARATUS

(75) Inventors: Masato Shimada, Nagano-ken (JP); Yoshinao Miyata, Nagano-ken (JP); Tomoaki Takahashi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 11 days.

(21) Appl. No.: 11/334,442

(22) Filed: Jan. 19, 2006

(65) Prior Publication Data

US 2006/0176343 A1 Aug. 10, 2006

(30) Foreign Application Priority Data

Jan. 26, 2005 (JP) ............................ 2005-017900
Oct. 19, 2005 (JP) ............................ 2005-304493

(51) Int. Cl.
*H01L 41/047* (2006.01)
*B41J 2/05* (2006.01)

(52) U.S. Cl. ...................... 310/365; 310/328; 310/366; 347/70

(58) Field of Classification Search ................ 310/328, 310/365, 366; 347/68, 70, 71
See application file for complete search history.

(56) References Cited

U.S. PATENT DOCUMENTS 4,115,789 A * 9/1978 Fischbeck .................... 347/70
6,142,614 A * 11/2000 Hashizume et al. .......... 347/70
6,209,994 B1 * 4/2001 Furuhata et al. .............. 347/68
6,840,601 B2 * 1/2005 Miyata ........................ 347/70

FOREIGN PATENT DOCUMENTS

JP 2004-001366 A 1/2004
JP 2004-001431 A 1/2004
JP 2004-130558 A 4/2004
JP 2004-224035 A 8/2004

* cited by examiner

*Primary Examiner*—Thomas M. Dougherty
(74) *Attorney, Agent, or Firm*—Sughrue Mion, PLLC

(57) ABSTRACT

A liquid-jet head is provided. In the liquid-jet head, a lower electrode, as a common electrode common to a plurality of piezoelectric elements, is continuously formed as far as an outer region opposite the piezoelectric elements, an auxiliary electrode layer is provided which comprises the same layers as layers constituting a lead-out electrode, and which is electrically connected to the lower electrode located outwardly of the region opposite the piezoelectric elements, a first insulation film at least in the vicinity of an end portion of a passage-forming substrate in a direction parallel to the arrangement of the piezoelectric elements is provided with a penetrated portion in a region opposite the auxiliary electrode layer, and the auxiliary electrode layer is in contact with the lower electrode via the penetrated portion provided in the first insulation film.

22 Claims, 13 Drawing Sheets

LIQUID-JET HEAD AND LIQUID-JET APPARATUS

BACKGROUND OF THE INVENTION

1. Field of the Invention

This invention relates to a liquid-jet head and a liquid-jet apparatus in which a part of a pressure generating chamber communicating with a nozzle orifice for ejection of liquid droplets is composed of a vibration plate, a piezoelectric element is formed on the vibration plate, and liquid droplets are ejected by displacement of the piezoelectric element. More particularly, the invention relates to an ink-jet recording head and an ink-jet recording apparatus for ejecting ink as a liquid.

2. Description of the Related Art

In an ink-jet recording head, a part of a pressure generating chamber communicating with a nozzle orifice for ejection of ink droplets is composed of a vibration plate, and the vibration plate is deformed by a piezoelectric element to pressurize ink in the pressure generating chamber, thereby ejecting ink droplets from the nozzle orifice. Two types of the ink-jet recording heads are put into practical use. One of them uses a piezoelectric actuator of a longitudinal vibration mode which expands and contracts in the axial direction of the piezoelectric element. The other uses a piezoelectric actuator of a flexural vibration mode.

The former type can change the volume of the pressure generating chamber by abutting the end surface of the piezoelectric element against the vibration plate, thus making it possible to manufacture a head suitable for high density printing. However, this necessitates a difficult process in which the piezoelectric element is cut and divided in a comb tooth shape coincident with the array pitch of the nozzle orifice, and an operation for aligning and fixing the cut and divided piezoelectric element to the pressure generating chamber. Thus, the problem arises that the manufacturing process is complicated. With the latter type, on the other hand, the piezoelectric element can be fabricated and installed on the vibration plate by a relatively simple process in which a green sheet, as a piezoelectric material, is affixed to the vibration plate in agreement with the shape of the pressure generating chamber, and is then sintered. However, a certain size of vibration plate is required due to the usage of flexural vibration, thus posing the problem that a high density array of the piezoelectric elements is difficult.

In order to solve the disadvantage of the latter recording head, a proposal has been made for a recording head in which a uniform piezoelectric material layer is formed across the entire surface of the vibration plate by a deposition technology, the piezoelectric material layer is cut and divided into a shape corresponding to the pressure generating chamber by a lithography method, and the piezoelectric element is formed so as to be independent of one another piezoelectric element for each pressure generating chamber. According to this process, the operation for affixing the piezoelectric element to the vibration plate is unnecessary. Moreover, the advantage is obtained that not only the piezoelectric element can be fabricated and installed in high density by the lithography method which is an accurate and simple method, but also the thickness of the piezoelectric element can be rendered small and a high speed drive can be accomplished.

With the ink-jet recording head having the piezoelectric elements arranged in a high density as described above, one of electrodes (i.e., a common electrode) of each piezoelectric element is formed to be common to the plurality of piezoelectric elements. Thus, when many of the piezoelectric elements are driven at the same time to eject many ink droplets at one time, the problem is presented that a drop in voltage occurs, leading to an unstable amount of displacement of the piezoelectric element and deteriorated ink ejection characteristics. To solve such a problem, a multi-layered electrode layer, a connecting wiring layer, etc., which comprise a conductive material, are provided on a lower electrode film which is the common electrode of the piezoelectric element. By so doing, it is attempted to lower the resistance value of the lower electrode film substantially, thereby preventing the occurrence of a drop in voltage (see, for example, Japanese Patent Application Laid-Open No. 2004-1431).

However, if the multi-layered electrode layer is directly formed on the lower electrode film, as in the structure described in the above patent document, there may be a problem such that stray current corrosion occurs between the lower electrode film and the multi-layered electrode layer in forming the multi-layered electrode layer.

Such a problem is not limited to the ink-jet recording head for ejecting ink, but also holds true of other liquid-jet heads for ejecting liquid droplets other than ink.

SUMMARY OF THE INVENTION

The present invention has been accomplished in the light of the above-described circumstances. It is an object of the invention to provide a liquid-jet head and a liquid-jet apparatus which can retain satisfactory liquid ejection characteristics and can obtain stable liquid ejection characteristics.

A first aspect of the present invention for attaining the above object is a liquid-jet head, comprising:

a passage-forming substrate in which pressure generating chambers communicating with nozzle orifices are formed;

piezoelectric elements provided on one surface side of the passage-forming substrate, and each comprising a lower electrode, a piezoelectric layer, and an upper electrode; and a lead-out electrode at least including a first lead electrode drawn from each of the piezoelectric elements, and wherein the lower electrode, which is a common electrode common to the plurality of piezoelectric elements, is continuously formed as far as an outside of a region opposite the piezoelectric elements, an auxiliary electrode layer is provided which comprises layers identical with layers constituting the lead-out electrode, and which is electrically connected to the lower electrode located outwardly of the region opposite the piezoelectric elements, a first insulation film covering the piezoelectric elements extends to a region where the auxiliary electrode layer is formed, in the first insulation film at least in a vicinity of an end portion of the passage-forming substrate in a direction parallel to the arrangement of the piezoelectric elements, a penetrated portion is provided in a region opposite the auxiliary electrode layer, and the auxiliary electrode layer is in contact with the lower electrode via the penetrated portion provided in the first insulation film.

In the first aspect, the resistance value of the lower electrode, which is the common electrode, is substantially decreased by the auxiliary electrode layer. Consequently, a drop in voltage when the piezoelectric elements are driven can be prevented, and the liquid ejection characteristics are maintained always satisfactorily. Moreover, the vicinity of the end portion of the auxiliary electrode layer is located on the first insulation film. Thus, stray current corrosion can be prevented from occurring between the auxiliary electrode layer and the lower electrode during the manufacturing process, and the auxiliary electrode layer can be formed in a satisfactory manner.

A second aspect of the present invention is the liquid-jet head according to the first aspect, characterized in that the auxiliary electrode layer at least includes a first conductive layer comprising layers identical with those of the first lead electrode.

In the second aspect, the resistance value of the lower electrode, which is the common electrode, can be reliably decreased by the first conductive layer. Since the first conductive layer is formed from the same layers as the first lead electrode, moreover, the auxiliary electrode layer can be formed without need to increase steps in the manufacturing process.

A third aspect of the present invention is the liquid-jet head according to the second aspect, characterized in that the lead-out electrode includes a second lead electrode drawn from the first lead electrode, the auxiliary electrode layer includes a second conductive layer comprising layers identical with those of the second lead electrode and provided on the first conductive layer via a second insulation film, the second insulation film has a penetrated portion provided at least in a vicinity of the end portion of the passage-forming substrate in the direction parallel to the arrangement of the piezoelectric elements, and the second conductive layer is in contact with the first conductive layer via the penetrated portion provided in the second insulation film.

In the third aspect, the substantial resistance value of the lower electrode, which is the common electrode, is further decreased, whereby a drop in voltage at the time of driving the piezoelectric elements can be more reliably prevented. Furthermore, the vicinity of the end portion of the second conductive layer is located on the second insulation film. Thus, stray current corrosion can be prevented from occurring between the first conductive layer and the second conductive layer during the manufacturing process, and the second conductive layer can be formed in a satisfactory manner.

A fourth aspect of the present invention is the liquid-jet head-according to the first aspect, characterized in that the lead-out electrode includes the first lead electrode and the second lead electrode drawn from the first lead electrode, and the auxiliary electrode layer is composed of the second conductive layer comprising the layers identical with those of the second lead electrode.

In the fourth aspect, the substantial resistance value of the lower electrode, which is the common electrode, can be reliably decreased by the second conductive layer. Since the second conductive layer is formed from the same layers as the second lead electrode, moreover, the auxiliary electrode layer can be formed without need to increase steps in the manufacturing process.

A fifth aspect of the present invention is the liquid-jet head according to any one of the first to fourth aspects, characterized in that the first insulation film is continuously provided in a region corresponding to the piezoelectric elements except junctions between the first lead electrodes and the piezoelectric elements.

In the fifth aspect, the piezoelectric elements are covered with the first insulation film, so that damage to the piezoelectric elements (piezoelectric layer) due to moisture can be prevented.

A sixth aspect of the present invention is the liquid-jet head according to the fifth aspect, characterized in that the first insulation film comprises an inorganic insulation material.

In the sixth aspect, the piezoelectric elements can be more reliably protected with the first insulation film.

A seventh aspect of the present invention is the liquid-jet head according to the third aspect, characterized in that the second insulation film is continuously provided in the region corresponding to the piezoelectric elements except junctions between the first lead electrodes and the second lead electrodes.

In the seventh aspect, the piezoelectric elements can be covered with the second insulation film, so that damage to the piezoelectric elements (piezoelectric layer) due to moisture can be prevented.

An eighth aspect of the present invention is the liquid-jet head according to the seventh aspect, characterized in that the second insulation film comprises an inorganic insulation material.

In the eighth aspect, the piezoelectric elements can be more reliably protected with the second insulation film.

A ninth aspect of the present invention is the liquid-jet head according to the sixth or eighth aspect, characterized in that the inorganic insulation material is aluminum oxide.

In the ninth aspect, the piezoelectric elements can be even more reliably protected with the first or second insulation film.

A tenth aspect of the present invention is the liquid-jet head according to any one of the first to ninth aspects, further comprising a lower electrode lead-out electrode drawn from the lower electrode between the piezoelectric elements adjacent to each other, the lower electrode lead-out electrode being connected to the auxiliary electrode layer.

In the tenth aspect, the lower electrode lead-out electrode is formed to be continuous with the auxiliary electrode layer, so that the occurrence of a drop in voltage can be more reliably prevented.

An eleventh aspect of the present invention is a liquid-jet apparatus including the liquid-jet head of any one of the first to tenth aspects.

In the eleventh aspect, a liquid-jet apparatus with enhanced durability and reliability can be achieved.

BRIEF DESCRIPTION OF THE DRAWINGS

For a more complete understanding of the present invention and the advantages thereof, reference is now made to the following descriptions in conjunction with the accompanying drawings.

DESCRIPTION OF THE PREFERRED EMBODIMENTS

The present invention will now be described in detail based on the embodiments offered below.

Embodiment 1

Figure 1:
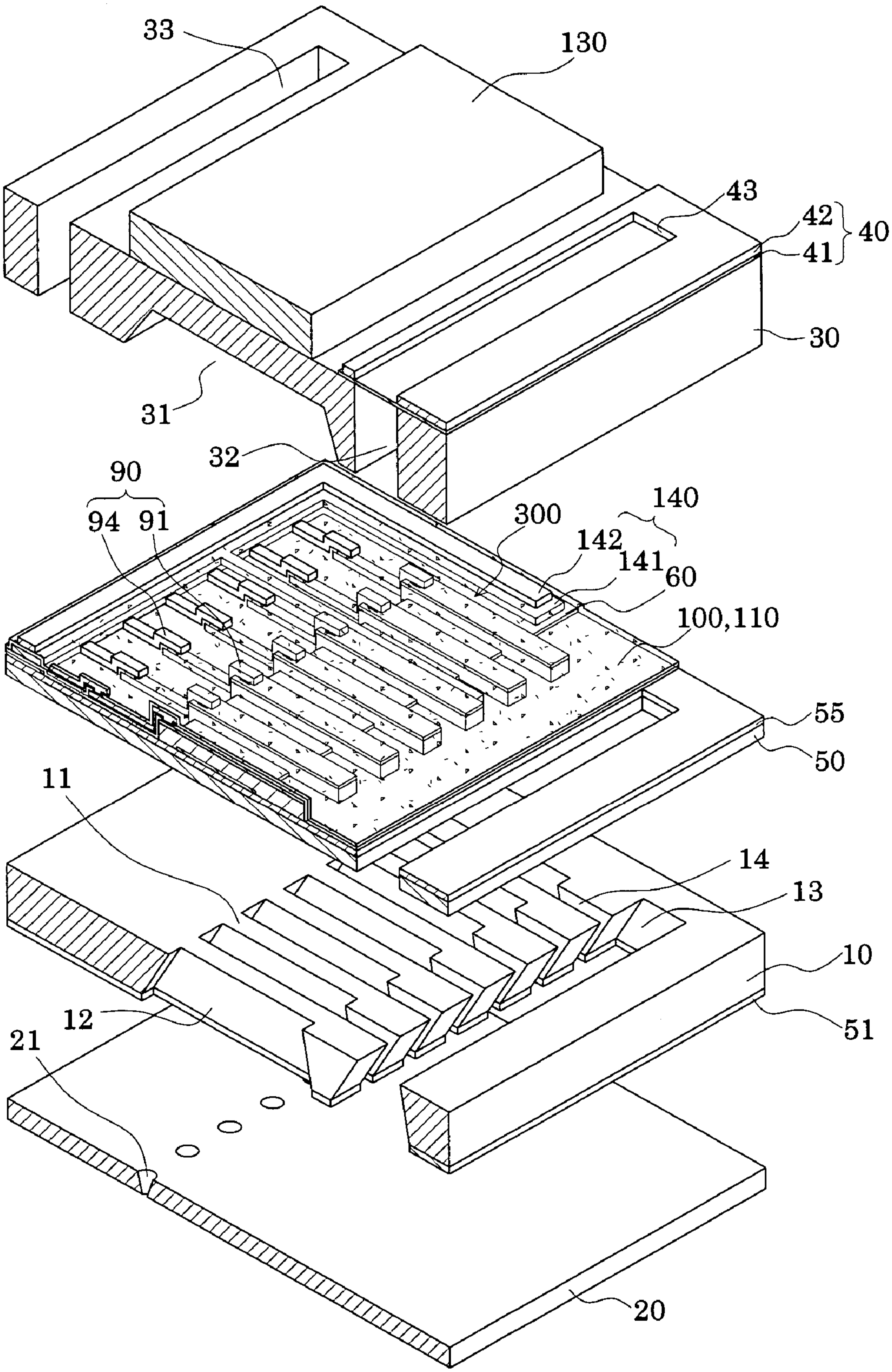
FIG. 1 is an exploded perspective view of a recording head according to Embodiment 1.
Figure 2A:
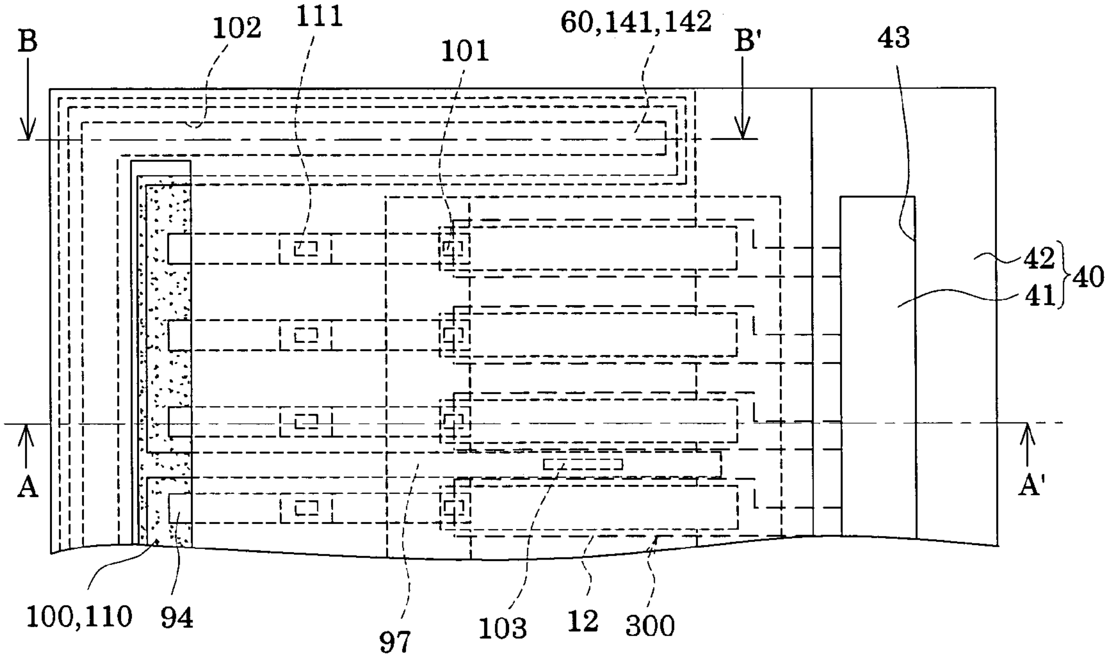
FIGS. 2A and 2B are a plan view and a sectional view, respectively, of the recording head according to Embodiment 1.
Figure 2B:
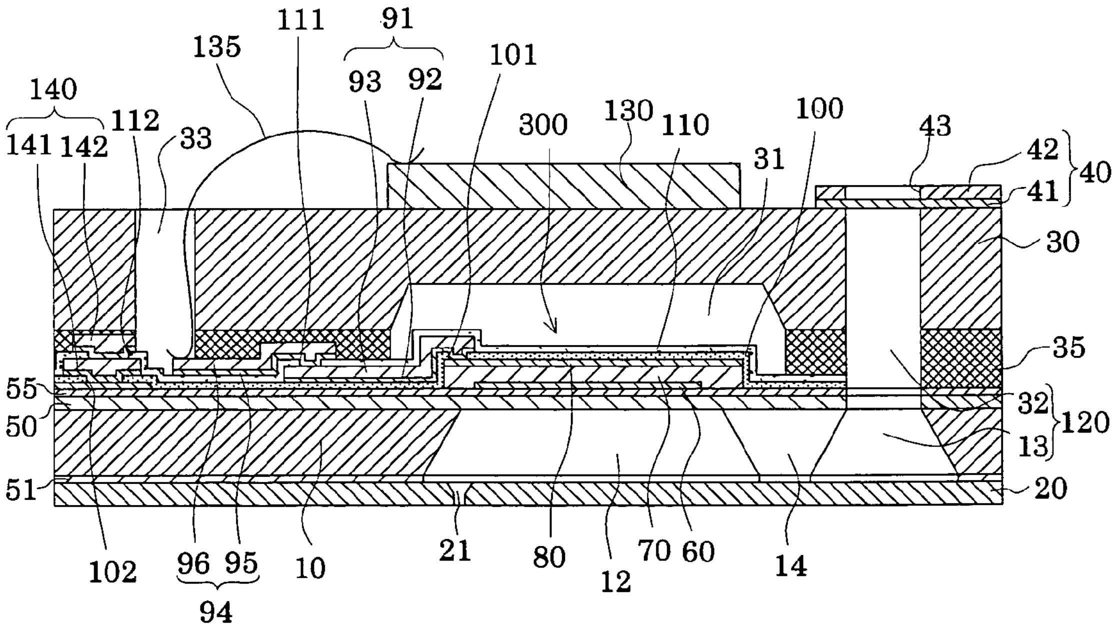
Figure 3:
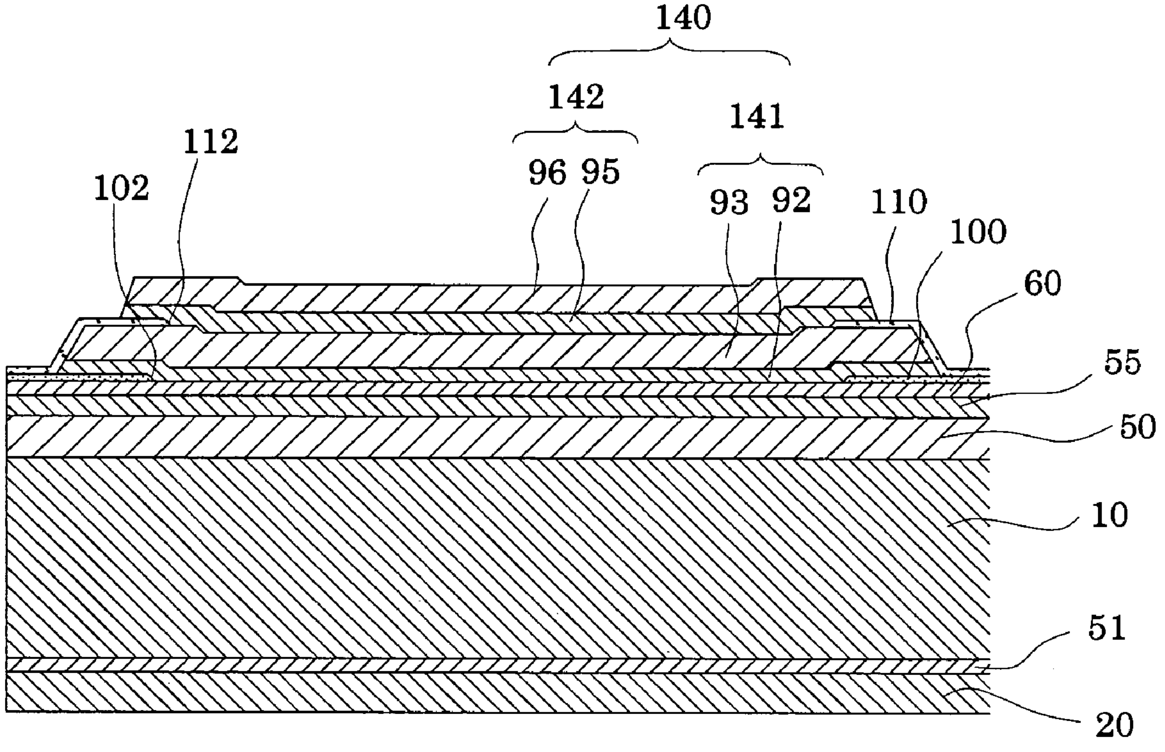
FIG. 3 is a sectional view showing essential parts of the recording head according to Embodiment 1.

FIG. 1 is an exploded perspective view showing an ink-jet recording head according to Embodiment 1 of the present invention. FIG. 2A is a plan view of the ink-jet recording head in FIG. 1, and FIG. 2B is a sectional view taken on line A-A' of FIG. 2A. FIG. 3 is a sectional view taken on line B-B' of FIG. 2A (showing the configuration of electrode layers formed in the vicinity of an end portion of a passage-forming substrate 10 in the direction parallel to the arrangement of a plurality of piezoelectric elements 300). The passage-forming substrate 10, in the present embodiment, consists of a single crystal silicon substrate having a plane (110) of the plane orientation. As illustrated, an elastic film 50 comprising silicon dioxide and having a thickness of 0.5 to 2 μm is present on one surface of the passage-forming substrate 10. In the passage-forming substrate 10, a plurality of pressure generating chambers 12 are disposed parallel in the width direction of the passage-forming substrate 10. A communicating portion 13 is formed in a region of the passage-forming substrate 10 longitudinally outward of the pressure generating chambers 12. The communicating portion 13 and each of the pressure generating chambers 12 are brought into communication via an ink supply path 14 provided for each of the pressure generating chambers 12. The communicating portion 13 communicates with a reservoir portion of a protective plate (to be described later) to constitute a reservoir serving as a common ink chamber for the respective pressure generating chambers 12. The ink supply path 14 is formed in a narrower width than that of the pressure generating chamber 12, and keeps constant the passage resistance of ink flowing from the communicating portion 13 into the pressure generating chamber 12.

Onto an opening surface of the passage-forming substrate 10, a nozzle plate 20 having nozzle orifices 21 bored therein is secured by an adhesive agent or a heat sealing film. Each of the nozzle orifices 21 communicates with the vicinity of the end of the pressure generating chamber 12 on the side opposite the ink supply path 14. The nozzle plate 20 comprises, for example, a glass ceramic, a single crystal silicon substrate, or stainless steel.

On the surface of the passage-forming substrate 10 opposite the opening surface, the elastic film 50 having a thickness, for example, of about 1.0 μm is formed, as described above. An insulation film 55 having a thickness, for example, of about 0.4 μm is formed on the elastic film 50. On the insulation film 55, a lower electrode film 60 with a thickness, for example, of about 0.2 μm, a piezoelectric layer 70 with a thickness, for example, of about 1.0 μm, and an upper electrode film 80 with a thickness, for example, of about 0.05 μm are formed in a laminated state by a process (to be described later) to constitute a piezoelectric element 300. The piezoelectric element 300 refers to a portion including the lower electrode film 60, the piezoelectric layer 70, and the upper electrode film 80. Generally, one of the electrodes of the piezoelectric element 300 is used as a common electrode, and the other electrode and the piezoelectric layer 70 are constructed for each pressure generating chamber 12 by patterning. A portion, which is composed of any one of the electrodes and the piezoelectric layer 70 that have been patterned, and which undergoes piezoelectric distortion upon application of voltage to both electrodes, is called a piezoelectric active portion. In the present embodiment, the lower electrode film 60 is used as the common electrode for the piezoelectric elements 300, while the upper electrode film 80 is used as an individual electrode of each piezoelectric element 300. However, there is no harm in reversing their usages for the convenience of a drive circuit or wiring. In either case, it follows that the piezoelectric active portion is formed for each pressure generating chamber 12. Herein, the piezoelectric elements 300 and a vibration plate, where displacement is caused by drive of the piezoelectric elements 300, are referred to collectively as a piezoelectric actuator. An upper electrode lead-out electrode 90, which extends from the vicinity of an end portion of the pressure generating chamber 12 on the side opposite to the ink supply path 14 to the vicinity of an end portion of the passage-forming substrate 10, is connected to the upper electrode film 80, as the individual electrode, of each piezoelectric element 300.

Figure 4:
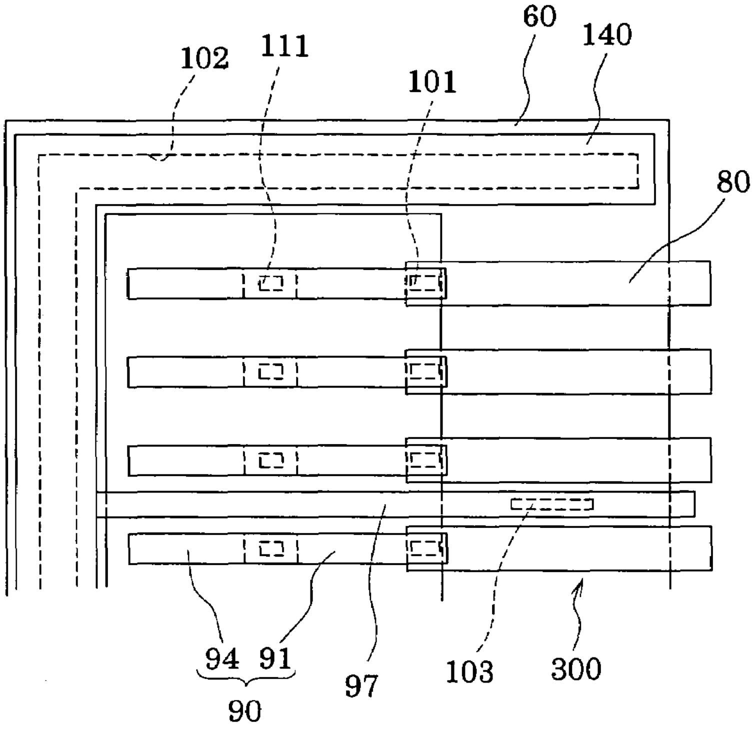
FIG. 4 is a plan view showing the outline of a wiring structure according to Embodiment 1.

The piezoelectric element 300 will be described in detail. The lower electrode film 60, as the common electrode, of the piezoelectric element 300 is formed in a region opposite the pressure generating chamber 12 in the longitudinal direction of the pressure generating chamber 12, and is provided continuously over a region corresponding to the plurality of pressure generating chambers 12 in the direction parallel to the arrangement of the pressure generating chambers 12, as shown in FIG. 4. The lower electrode film 60 extends to the vicinity of the end portion of the passage-forming substrate 10 in the direction parallel to the arrangement of the pressure generating chambers 12 and, in the present embodiment, is provided continuously so as to surround the periphery of the plurality of upper electrode lead-out electrodes 90, which have been drawn from the respective piezoelectric elements 300.

The piezoelectric layer 70 and the upper electrode film 80 are basically provided in the region opposite the pressure generating chamber 12, but in the longitudinal direction of the pressure generating chamber 12, extend outwardly from the end portion of the lower electrode film 60, while the end surfaces of the lower electrode film 60 are covered with the piezoelectric layer 70.

In the pattern region of the respective layers constituting the piezoelectric element 300, a first insulation film 100 comprising an inorganic insulation material is formed, and the respective layers constituting the piezoelectric element 300 are covered with the first insulation film 100. The first insulation film 100 extends to a region where an auxiliary electrode layer 140 (to be described later) is formed. The upper electrode lead-out electrode 90, in the present embodiment, includes a first lead electrode 91 connected to the upper electrode film 80, and a second lead electrode 94 connected to the first lead electrode 91. The first lead electrode 91 extends onto the first insulation film 100, and is also connected to the upper electrode film 80 via a contact hole 101 formed in the first insulation film 100. The respective layers constituting the first lead electrode 91 and the piezoelectric element 300 are further covered with a second insulation film 110 comprising an inorganic insulation material. The second insulation film 110 extends to a region where the auxiliary electrode layer 140 is formed, as does the first insulation film. The second lead electrode 94 constituting the upper electrode lead-out electrode 90 extends onto the second insulation film 110, and is connected to the first lead electrode 91 via a contact hole 111 formed in the second insulation film 110. A connecting wiring 135, led out of a drive IC 130 mounted on a protective plate 30 (to be described later), is connected to the vicinity of a front end portion of the second lead electrode 94.

The first lead electrode 91, in the present embodiment, is composed of an adherence layer 92 with a thickness of the order of 0.1 to 0.5 μm, and a metallic layer 93 with a thickness of the order of 0.5 to 3 μm. Examples of the material for the adherence layer 92 are nickel (Ni), chromium (Cr), titanium (Ti), copper (Cu), and titanium tungsten (TiW). Examples of the material for the metallic layer 93 are gold (Au) and aluminum (Al). In the present embodiment, the adherence layer 92 constituting the first lead electrode 91 comprises titanium tungsten (TiW), and the metallic layer 93 comprises aluminum (Al).

The second lead electrode 94 is composed of an adherence layer 95 and a metallic layer 96, as is the first lead electrode 91. In the present embodiment, for example, the adherence layer 95 constituting the second lead electrode 94 comprises nickel chromium (NiCr), and the metallic layer 96 comprises gold (Au).

The material for the first and second insulation films 100 and 110 is not limited, as long as it is an inorganic insulation material. Examples of this material are aluminum oxide ($AlO_x$) and tantalum oxide ($TaO_x$). Particularly, it is preferred to use an inorganic amorphous material, for example, aluminum oxide ($Al_2O_3$). To attain the object of the present invention, it is possible, of course, to use an organic insulation material such as polyimide. However, it is preferred to form an insulation film of an inorganic insulation material, from the viewpoint that humidity resistance can be ensured in a smaller film thickness than that of an organic insulation material.

On the lower electrode film 60 in the region outward of the parallel-arranged pressure generating chambers 12, the auxiliary electrode layer 140 is provided via the first insulation film 100 and is in contact with the lower electrode film 60.

The auxiliary electrode layer 140 comprises the same layers as the layers constituting the upper electrode lead-out electrode 90. In the present embodiment, for example, the auxiliary electrode layer 140 includes a first conductive layer 141 comprising the same layers as those of the first lead electrode 91 (i.e., adherence layer 92 and metallic layer 93), and a second conductive layer 142 comprising the same layers as those of the second lead electrode 94 (i.e., adherence layer 95 and metallic layer 96). As shown in FIG. 3, the first insulation film 100 is provided with a penetrated portion 102 in the vicinity of the end portion of the passage-forming substrate 10 in the direction parallel to the arrangement of the piezoelectric elements 300. In the present embodiment, the penetrated portion 102 is provided continuously to extend to the vicinity of the end portion of the passage-forming substrate 10 in the longitudinal direction of the piezoelectric elements 300. That is, the penetrated portion 102 is continuously provided so as to surround the periphery of the upper electrode lead-out electrodes 90. The first conductive layer 141 is connected to the lower electrode film 60 via the penetrated portion 102 of the first insulation film 100. Also, the penetrated portion 102 in provided in the region opposite the first conductive layer 141. That is, the first conductive layer 141 is formed such that the vicinity of its end portion is located on the first insulation film 100.

In the present embodiment, the penetrated portion 102 is formed continuously around the upper electrode lead-out electrodes 90. The penetrated portion 102 may, at least, be provided in the first insulation film 100 in the vicinity of the end portion of the passage-forming substrate 10 in the direction parallel to the arrangement of the piezoelectric elements 300, and need not be provided in other regions.

The second conductive layer 142 is provided on the first conductive layer 141 via the above-mentioned second insulation film 110. The second conductive layer 142 and the first conductive layer 141 are connected via a penetrated portion 112 formed in the second insulation film 110 within the region opposite the second conductive layer 142. That is, the second conductive layer 142, like the first conductive layer 141, is formed such that the, vicinity of its end portion is located on the second insulation film 110.

In the present embodiment, a lower electrode lead-out electrode 97 continued from the first conductive layer 141 is provided in a region between the parallel-arranged piezoelectric elements 300, for example, such that about one lower electrode lead-out electrode 97 is provided for ten of the piezoelectric elements. That is, the lower electrode lead-out electrode 97 is composed of the adherence layer 92 and the metallic layer 93 constituting the first lead electrode 91. The lower electrode lead-out electrode 97 is connected to the lower electrode film 60, in a region corresponding to the pressure generating chamber 12 between the adjacent piezoelectric elements 300, via a contact hole 103 provided in the first insulation film 100, and extends along the lead-out direction of the upper electrode lead-out electrode 90. The adherence layer 92 constituting the lower electrode lead-out electrode 97, etc. is provided in order to prevent the reaction of the metallic layer 93 comprising aluminum (Al) with the lower electrode film 60, thereby causing mutual diffusion.

According to the features of the present embodiment described above, the auxiliary electrode layer 140 consisting of the first conductive layer 141 and the second conductive layer 142 is electrically connected to the lower electrode film 60 which is the common electrode of the piezoelectric element 300. Thus, the resistance value of the lower electrode film 60 substantially decreases. Consequently, the occurrence of a drop in voltage can be prevented even when many of the piezoelectric elements 300 are simultaneously driven. In the present embodiment, in particular, the lower electrode film 60 and the auxiliary electrode layer 140 are brought into conduction via the penetrated portion 102 of a relatively large opening area. Moreover, a plurality of the lower electrode lead-out electrodes 97 are formed to be continuous with the first conductive layer 141 constituting the auxiliary electrode layer 140. Thus, the occurrence of a drop in voltage can be more reliably prevented. Hence, the ink ejection characteristics, which are always satisfactory and stable, can be obtained, and variations in ink ejection characteristics among the piezoelectric elements can also be decreased. The penetrated portion 102, in the present embodiment, is provided continuously so as to surround the periphery of the upper electrode lead-out electrodes 90. However, this feature is not limitative, and a plurality of the penetrated portions 102 may be provided around the upper electrode lead-out electrodes 90. In the present embodiment, moreover, the plurality of the lower electrode lead-out electrodes 97 are provided, but this is not limitative, and at least one lower electrode lead-out electrode 97 may be provided.

Figure 5:
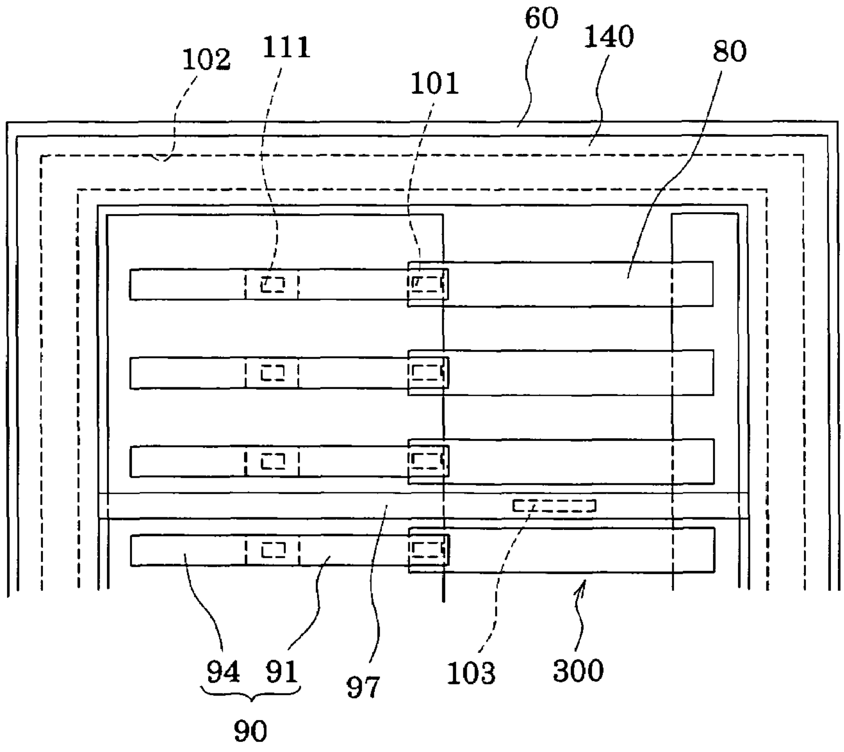
FIG. 5 is a plan view showing a modification of the wiring structure according to Embodiment 1.

In the present embodiment, the lower electrode film 60 is provided continuously around the plurality of upper electrode lead-out electrodes 90 drawn from the respective piezoelectric elements 300. However, as shown in FIG. 5, the lower electrode film 60 may be provided so as to surround not only the periphery of the upper electrode lead-out electrodes 90, but also the periphery of the respective piezoelectric elements 300. By this measure, the current-carrying capacity of the lower electrode film 60 is further increased, and can more reliably prevent the occurrence of a drop in voltage.

Figure 6:
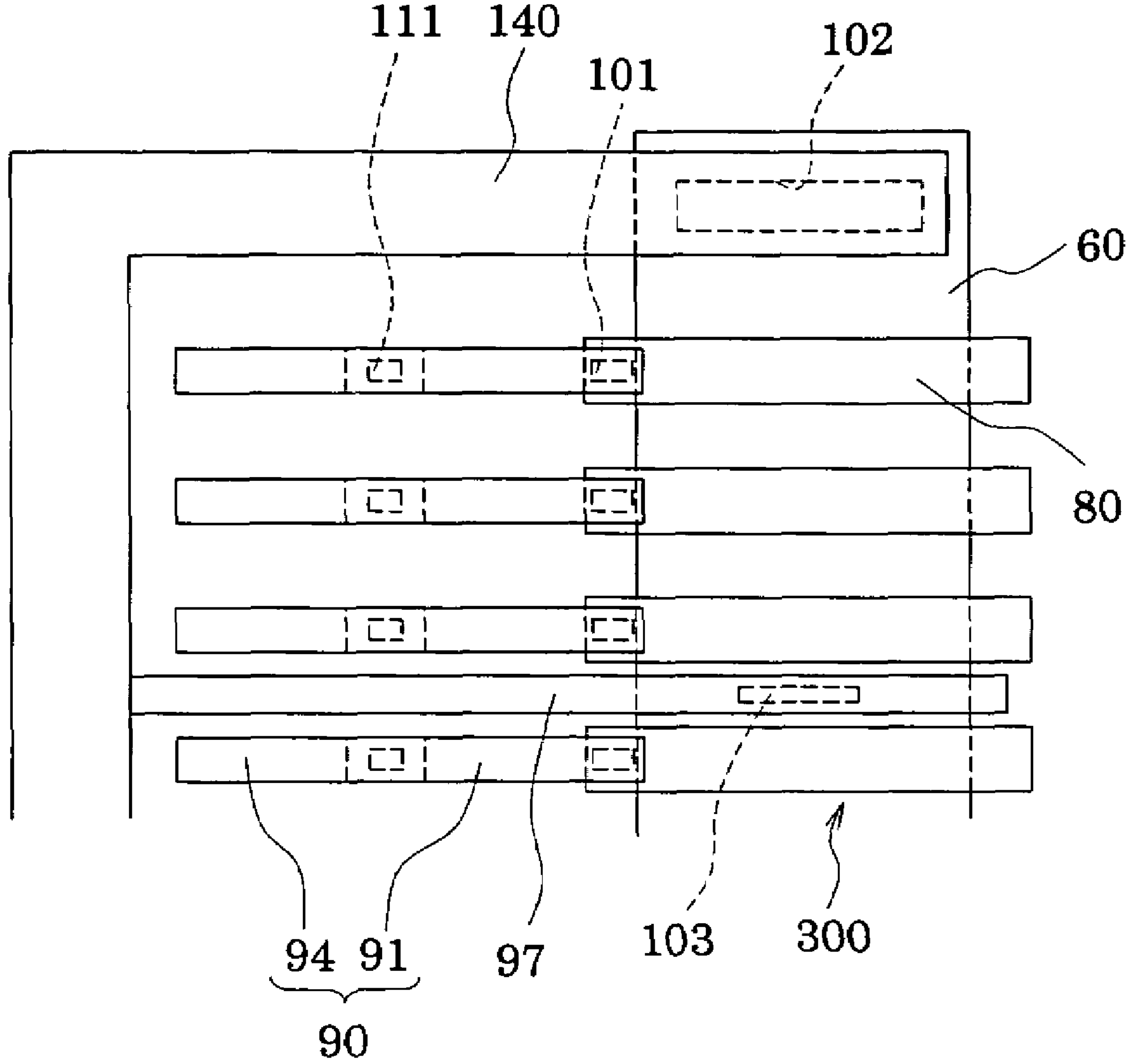
FIG. 6 is a plan view showing a modification of the wiring structure according to Embodiment 1.

In the present embodiment, moreover, the lower electrode film 60 is formed continuously around the upper electrode lead-out electrodes 90, and the auxiliary electrode layer 140 is formed on the lower electrode film 60. However, the auxiliary electrode layer 140 may have a portion thereof formed on the lower electrode film 60 and electrically connected to the lower electrode film 60. For example, as shown in FIG. 6, the lower electrode film 60 may extend, in a predetermined width, only along the direction parallel to the arrangement of the piezoelectric elements 300, and only the auxiliary electrode layer 140 may be continuously formed around the upper electrode lead-out electrodes 90. There is a case where the adhesion of the lower electrode film 60 to the insulation film 55 is weak in some region. By narrowing the area of the lower electrode film 60, however, the occurrence of peeling of the lower electrode film 60 can be minimized. As with the lower electrode film 60, the insulation film 55 constituting the vibration plate has weak adhesion to the elastic film 50 in some cases. Thus, the insulation film 55 in regions other than the regions corresponding to the pressure generating chambers 12 maybe removed. By so doing, the occurrence of peeling of the insulation film 55 can be minimized.

In the present embodiment, the first and second insulation films 100 and 110, comprising the inorganic insulation material, are formed to cover the regions corresponding to the piezoelectric elements 300, so that the piezoelectric elements 300 substantially do not contact the air. Thus, damage to the piezoelectric elements 300 (piezoelectric layer 70) due to water (moisture) in the air can be prevented.

To the passage-forming substrate 10 where the piezoelectric elements 300 are formed, a protective plate 30 having a piezoelectric element holding portion 31, which can ensure a space enough wide not to impede the movement of the piezoelectric elements 300, is joined, for example via an adhesive agent 35, in a region opposite the piezoelectric elements 300. Since the piezoelectric elements 300 are formed within the piezoelectric element holding portion 31, they are protected in a state in which they are substantially free from the influence of an external environment. The piezoelectric element holding portion 31 may be sealed, but of course, need not be sealed.

In the protective plate 30, moreover, a reservoir portion 32 is provided in a region corresponding to the communicating portion 13 of the passage-forming substrate 10. The reservoir portion 32, in the present embodiment, is provided along the direction parallel to the arrangement of the pressure generating chambers 12 so as to penetrate the protective plate 30 in its thickness direction. As mentioned above, the reservoir portion 32 is brought into communication with the communicating portion 13 of the passage-forming substrate 10 to constitute a reservoir 120 which serves as a common ink chamber for the respective pressure generating chambers 12. In a region opposite the reservoir portion 32 across the piezoelectric element holding portion, an exposure hole 33 is formed which penetrates the protective plate 30 in its thickness direction and through which the second lead electrode 94 is exposed. The connecting wiring 135 drawn from the drive IC 130 mounted on the protective plate 30 is connected in this exposure hole 33 to the second lead electrode 94 and the second conductive layer 142 (lower electrode film 60).

The material for the protective plate 30 is, for example, glass, a ceramic material, a metal, or a resin. Preferably, the protective plate 30 is formed of a material having nearly the same thermal expansion coefficient as that of the passage-forming substrate 10. In the present embodiment, the protective plate 30 is formed from a single crystal silicon substrate which is the same material as that for the passage-forming substrate 10.

Furthermore, a compliance plate 40, which consists of a sealing film 41 and a fixing plate 42, is joined onto the protective plate 30. The sealing film 41 comprises a low rigidity, flexible material (for example, a polyphenylene sulfide (PPS) film of 6 μm in thickness), and the sealing film 41 seals one surface of the reservoir portion 32. The fixing plate 42 is formed from a hard material such as a metal (for example, stainless steel (SUS) of 30 μm in thickness) A region of the fixing plate 42 opposite the reservoir 120 defines an opening portion 43 completely deprived of the plate in the thickness direction. Thus, one surface of the reservoir 120 is sealed only with the sealing film 41 having flexibility.

With the ink-jet recording head of the present embodiment described above, ink is taken in from an external ink supply means (not shown), and the interior of the head ranging from the reservoir 120 to the nozzle orifices 21 is filled with the ink. Then, according to recording signals from the drive IC 130 mounted on the protective plate 30, voltage is applied between the lower electrode film 60 and the upper electrode film 80 corresponding to the pressure generating chamber 12 to flexibly deform the elastic film 50, the insulation film 55, the lower electrode film 60 and the piezoelectric layer 70. As a result, the pressure inside the pressure generating chamber 12 rises to eject ink droplets through the nozzle orifice 21.

The method for producing the above-described ink-jet recording head will be described with reference to FIGS. 7A to 7D through FIGS. 12A to 12C. FIGS. 7A to 7D, 8A to 8C, 10A to 10C, and 12A to 12C are sectional views corresponding to those taken on line A-A' of FIG. 2A, while FIGS. 9A to 9C and 11A and 11B are sectional views corresponding to those taken on line B-B' of FIG. 2A.

Figure 7A:
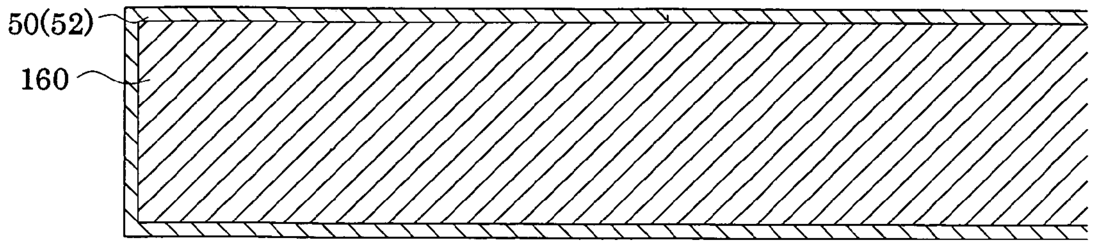
FIGS. 7A to 7D are sectional views showing steps in a manufacturing process for the recording head according to Embodiment 1.
Figure 7B:
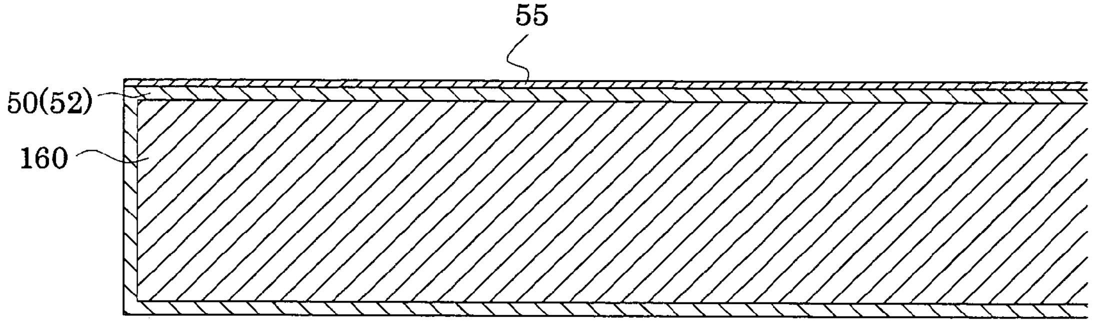
Figure 7C:
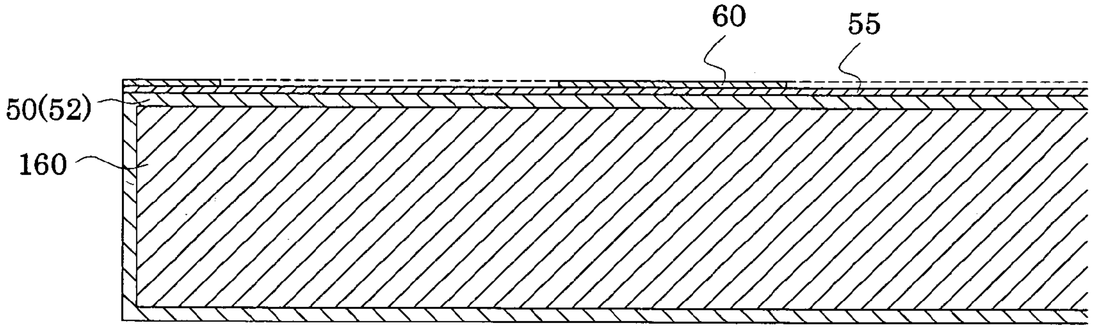

Firstly, as shown in FIG. 7A, a passage-forming substrate wafer 160, which is a silicon wafer, is thermally oxidized in a diffusion furnace at about 1,100° C. to form a silicon dioxide film 52 constituting the elastic film 50 on the surface of the wafer 160. In the present embodiment, a silicon wafer having a relatively large thickness of about 625 μm and having high rigidity is used as the passage-forming substrate wafer 160 (passage-forming substrate 10). Then, as shown in FIG. 7B, a zirconium (Zr) layer is formed on the elastic film 50 (silicon dioxide film 52), and then thermally oxidized in a diffusion furnace, for example, at 500 to 1,200° C. to form the insulation film 55 comprising zirconium oxide ($ZrO_2$). Then, as shown in FIG. 7C, platinum and iridium, for example, are stacked on the insulation film 55 to form the lower electrode film 60, whereafter the lower electrode film 60 is patterned into a predetermined shape.

Figure 7D:
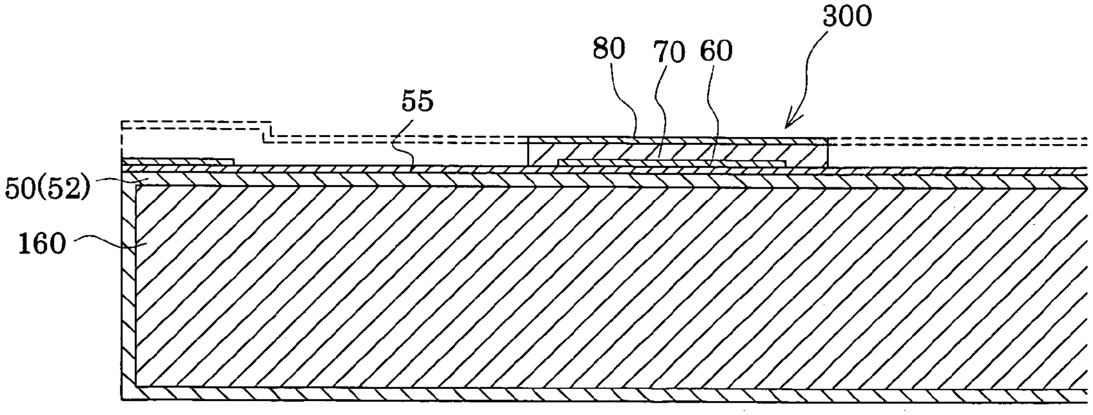

Then, as shown in FIG. 7D, the piezoelectric layer 70 comprising, for example, lead zirconate titanate (PZT), and the upper electrode film 80 comprising, for example, iridium (Ir) are formed on the entire surface of the passage-forming substrate wafer 160. Then, the piezoelectric layer 70 and the upper electrode film 80 are patterned in a region opposite the respective pressure generating chambers 12 to form the piezoelectric elements 300.

The material for the piezoelectric layer 70 may be, for example, a ferroelectric piezoelectric material such as lead zirconate titanate (PZT), or a relaxor ferroelectric having a metal, such as niobium, nickel, magnesium, bismuth or yttrium, added to such a ferroelectric piezoelectric material. The composition of the piezoelectric layer 70 maybe chosen, as appropriate, in consideration of the characteristics, uses, etc. of the piezoelectric element. Its examples are $PbTiO_3$ (PT), $PbZrO_3$ (PZ), $Pb(Zr_xTi_{1-x})O_3$ (PZT), $Pb(Mg_{1/3}Nb_{2/3})O_3$—$PbTiO_3$ (PMN—PT), $Pb(Zn_{1/3}Nb_{2/3})O_3$—$PbTiO_3$ (PZN—PT), $Pb(Ni_{1/3}Nb_{2/3})O_3$—$PbTiO_3$ (PNN—PT), $Pb(In_{1/2}Nb_{1/2})O_3$—$PbTiO_3$ (PIN—PT), $Pb(Sc_{1/3}Ta_{2/3})O_3$—$PbTiO_3$ (PST-PT), $Pb(Sc_{1/3}Nb_{2/3})O_3$—$PbTiO_3$ (PSN—PT), $BiScO_3$—$PbTiO_3$ (BS—PT), and $BiYbO_3$—$PbTiO_3$ (BY—PT). The method for forming the piezoelectric layer 70 is not limited to the sol-gel process. For example, MOD (metal-organic decomposition) may be used.

Figure 8A:
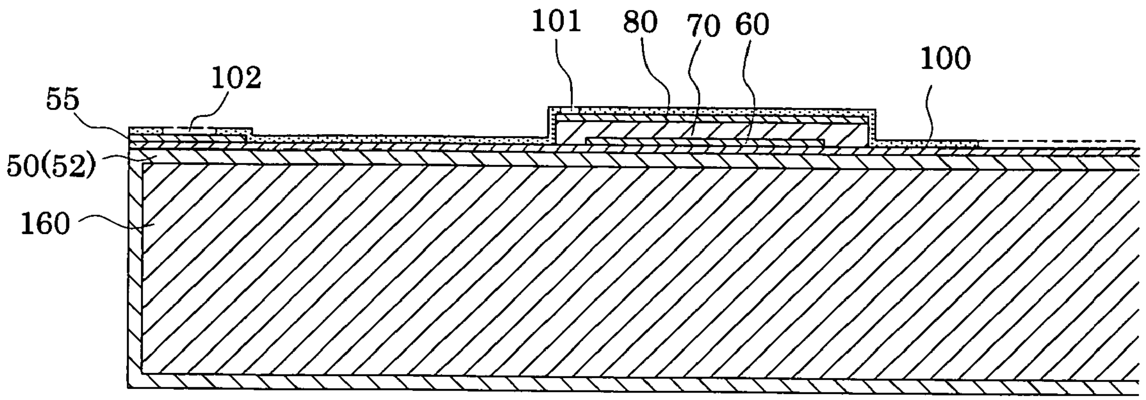
FIGS. 8A to 8C are sectional views showing the steps in the manufacturing process for the recording head according to Embodiment 1.
Figure 9A:
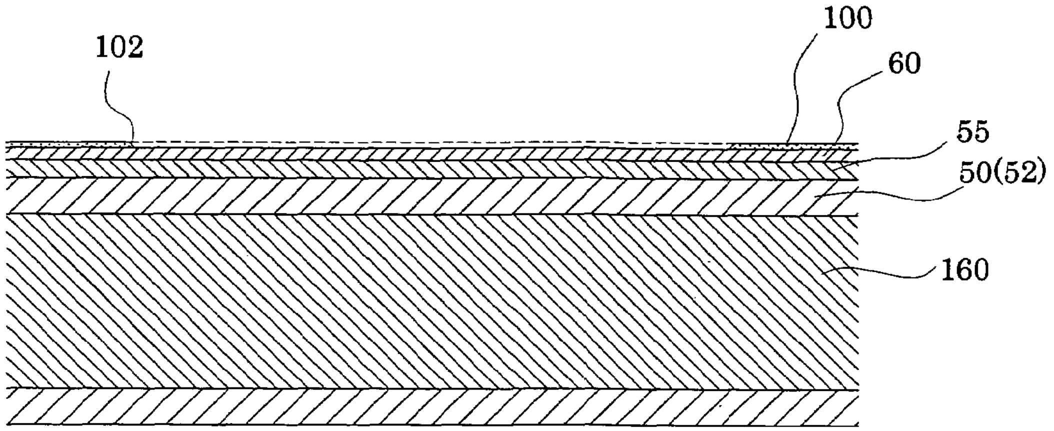
FIGS. 9A to 9C are sectional views showing the steps in the manufacturing process for the recording head according to Embodiment 1.

Then, the first insulation film 100 comprising aluminum oxide is formed. Concretely, as shown in FIG. 8A and FIG. 9A, after the first insulation film 100 is formed on the entire surface of the passage-forming substrate wafer 160, the first insulation film 100 is etched, for example, via a mask (not shown) comprising a resist or the like, whereby the contact holes 101, 103 and the penetrated portion 102 are formed.

In the present embodiment, the first insulation film 100 in regions other than the pattern region of the respective layers constituting the piezoelectric elements 300 is removed. Needless to say, the first insulation film 100 may be provided in regions other than the pattern region. The method of patterning the first insulation film 100 is not limited, but it is preferred, for example, to use dry etching such as ion milling. By this method, the first insulation film 100 can be selectively removed in a satisfactory manner.

Figure 8B:
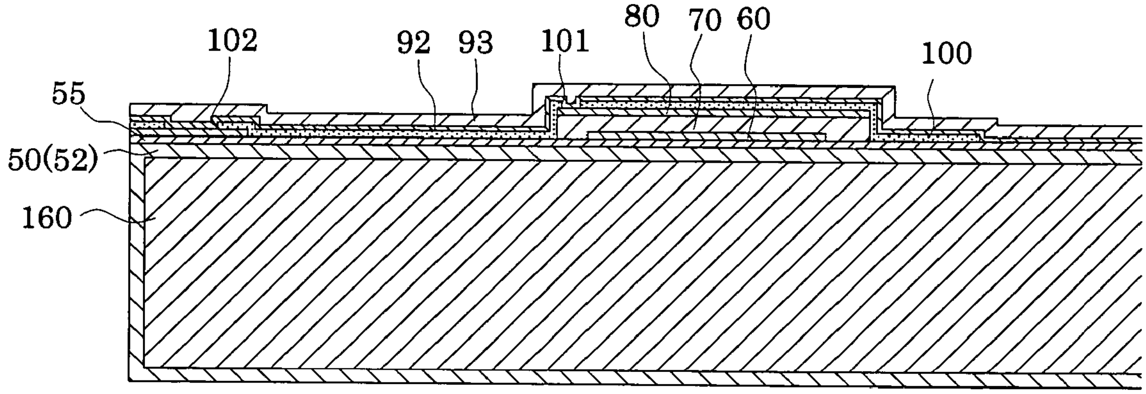
Figure 8C:
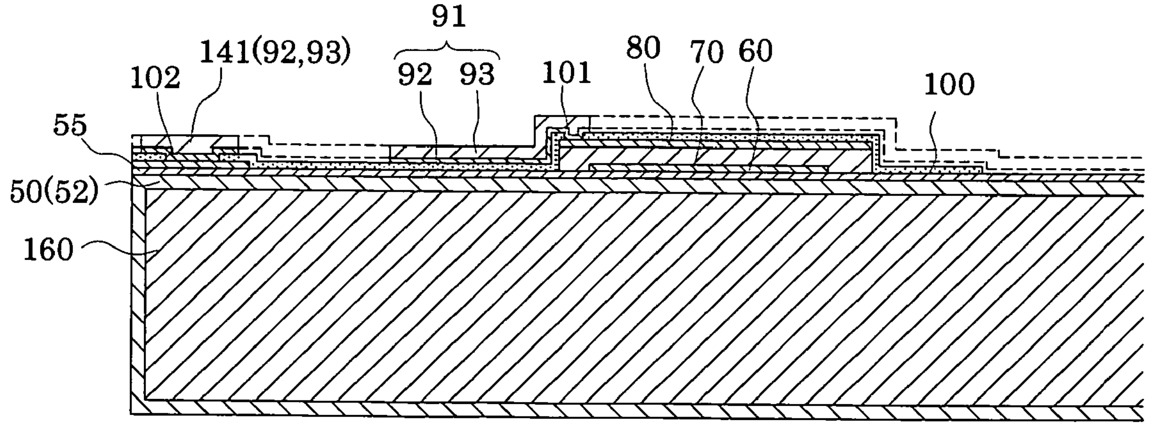
Figure 9B:
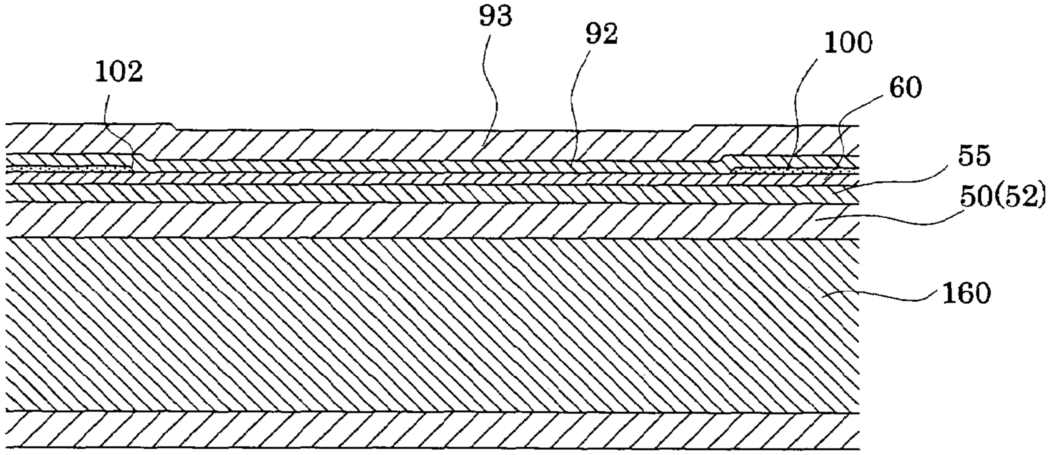
Figure 9C:
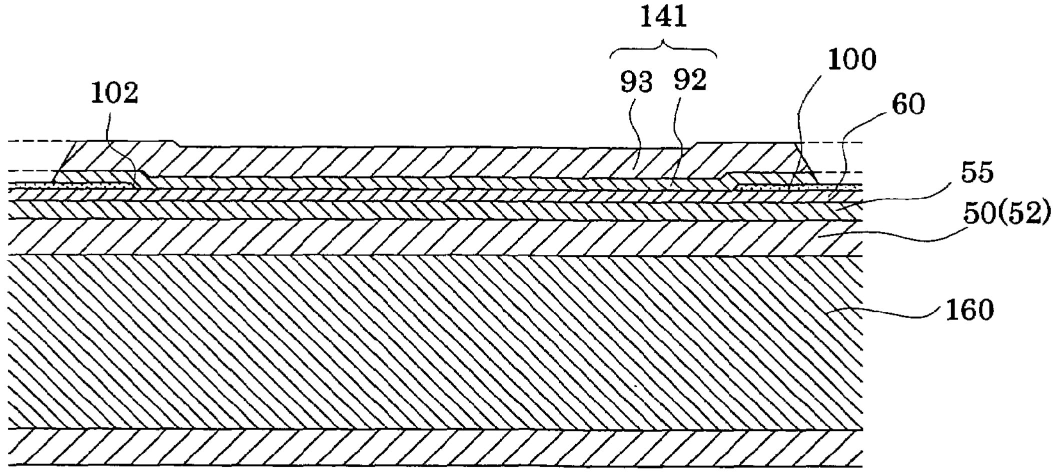

Then, the first lead electrode 91 is formed, and also the first conductive layer 141 constituting the auxiliary electrode layer 140 and the lower electrode lead-out electrode 97 are formed. Concretely, as shown in FIG. 8B and FIG. 9B, the adherence layer 92 comprising, for example, titanium tungsten (TiW) is formed on the entire surface of the passage-forming substrate wafer 160, and the metallic layer 93 comprising, for example, aluminum (Al) is formed on the entire surface of the adherence layer 92. Then, as shown in FIG. 8C and FIG. 9C, the metallic layer 93 and the adherence layer 92 are sequentially etched (wet-etched) via a mask (not shown) comprising, for example, a resist to form the first lead electrode 91, the first conductive layer 141 and the lower electrode lead-out electrode 97.

At this time, the first conductive layer 141 is in contact with the lower electrode film 60 via the penetrated portion 102 formed in the first insulation film 100 in the region opposite the first conductive layer 141. That is, the first conductive layer 141 is patterned so that the vicinity of the end portion of the first conductive layer 141 is located on the first insulation film 100. Because of this feature, when the first conductive layer 141 is patterned, no stray current corrosion occurs between the lower electrode film 60 and the first conductive layer 141, and the first conductive layer 141 can be formed satisfactorily.

Figure 10A:
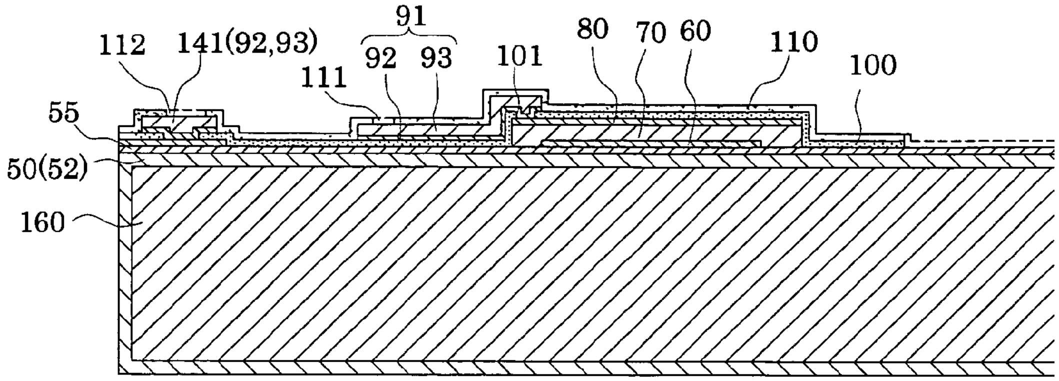
FIGS. 10A to 10C are sectional views showing the steps in the manufacturing process for the recording head according to Embodiment 1.
Figure 11A:
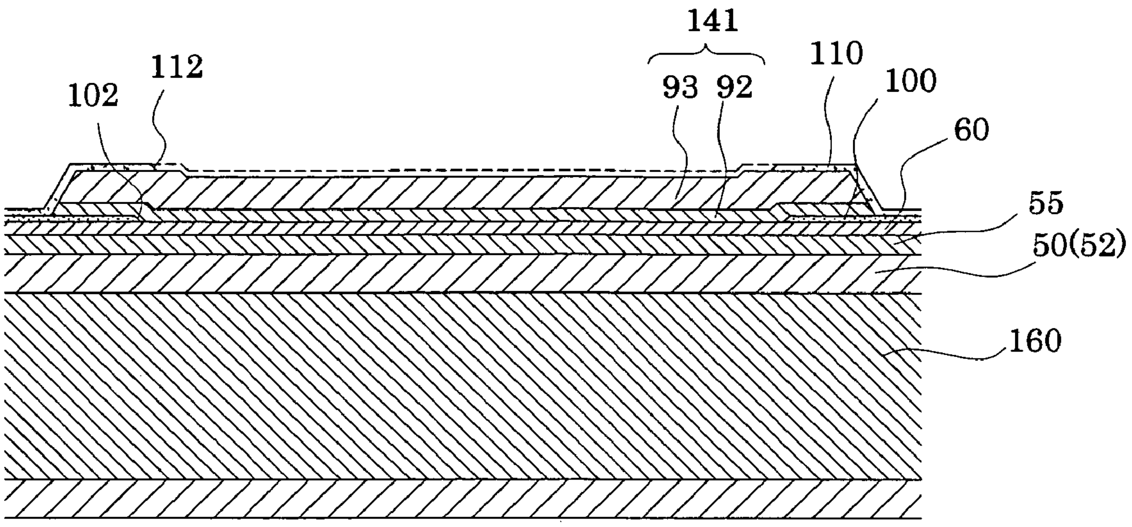
FIGS. 11A and 11B are sectional views showing the steps in the manufacturing process for the recording head according to Embodiment 1.

Then, the second insulation film 110 comprising aluminum oxide is formed. Concretely, as shown in FIG. 10A and FIG. 11A, after the second insulation film 110 is formed on the entire surface of the passage-forming substrate wafer 160, the second insulation film 110 is etched, for example, via a mask (not shown) comprising a resist or the like, whereby the contact hole 111 and the penetrated portion 112 are formed. In the present embodiment, the second insulation film 110 in regions other than the pattern region of the respective layers constituting the piezoelectric elements 300 is removed, as is the first insulation film 100.

Figure 10B:
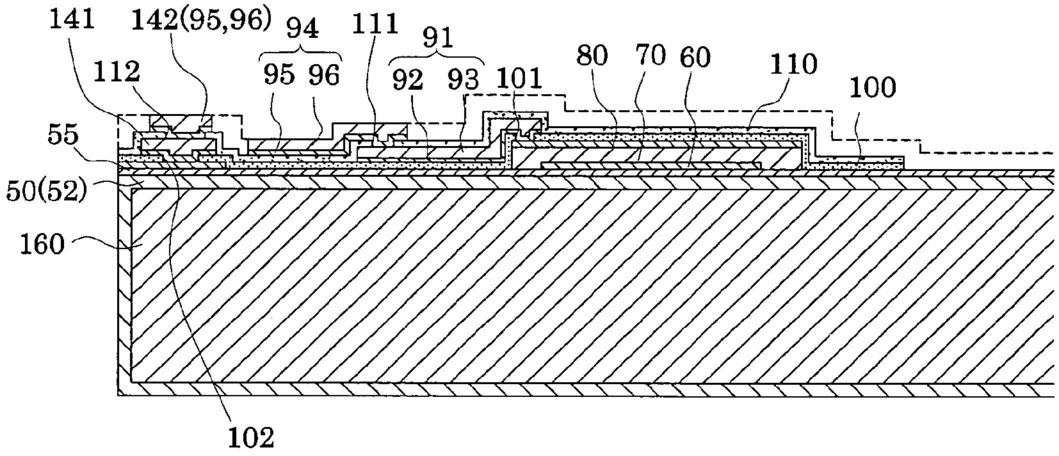
Figure 11B:
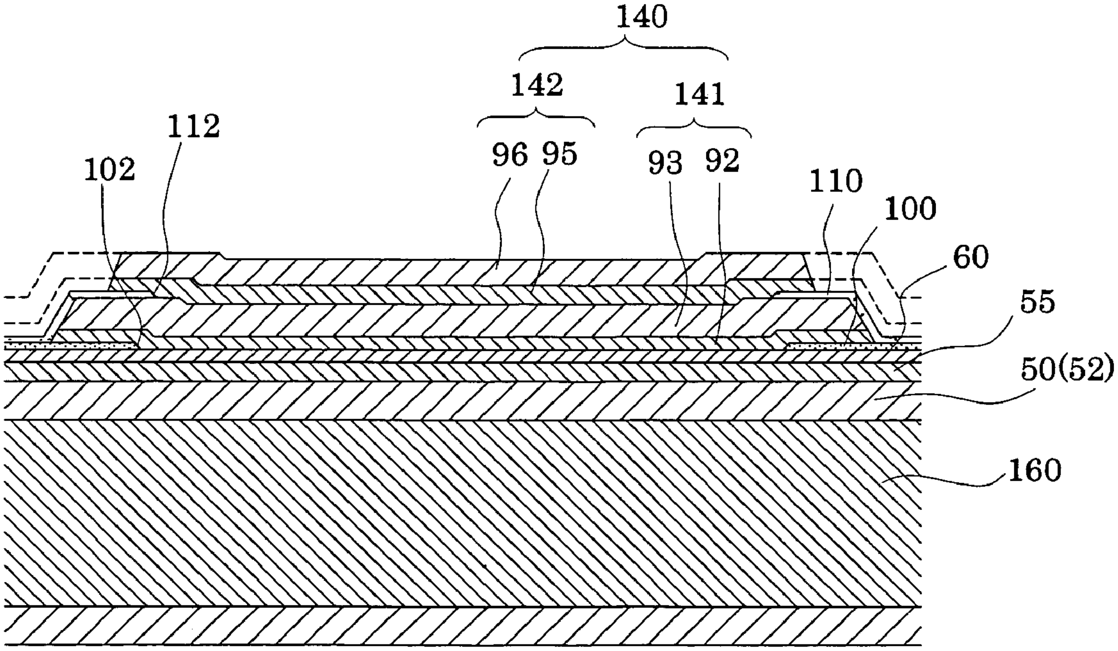

Then, the second lead electrode 94 and the second conductive layer 142 constituting the auxiliary electrode layer 140 are formed. For example, in the present embodiment, as shown in FIG. 10B and FIG. 11B, the adherence layer 95 comprising, for example, nickel chromium (NiCr) is formed-on the entire surface of the passage-forming substrate wafer 160, and the metallic layer 96 comprising, for example, gold (Au) is formed on the entire surface of the adherence layer 95. Then, the metallic layer 96 and the adherence layer 95 are sequentially etched via a mask pattern (not shown) to form the second lead electrode 94 and also form the second conductive layer 142 on the second insulation film 110. By this procedure, the auxiliary electrode layer 140 consisting of the first conductive layer 142 and the second conductive layer 142 is electrically connected to the lower electrode film 60 via the penetrated portion 102 of the first insulation film 100.

At this time, the second conductive layer 142 is in contact with the first conductive layer 141 via the penetrated portion 112 formed in the second insulation film 110 in the region opposite second conductive layer 142. That is, the second conductive layer 142 is patterned so that the end portion of the second conductive layer 142 is located on the second insulation film 110. Because of this feature, when the second conductive layer 142 is patterned, no stray current corrosion occurs between the first conductive layer 141 and the second conductive layer 142, and the second conductive layer 142 can be formed satisfactorily.

Figure 10C:
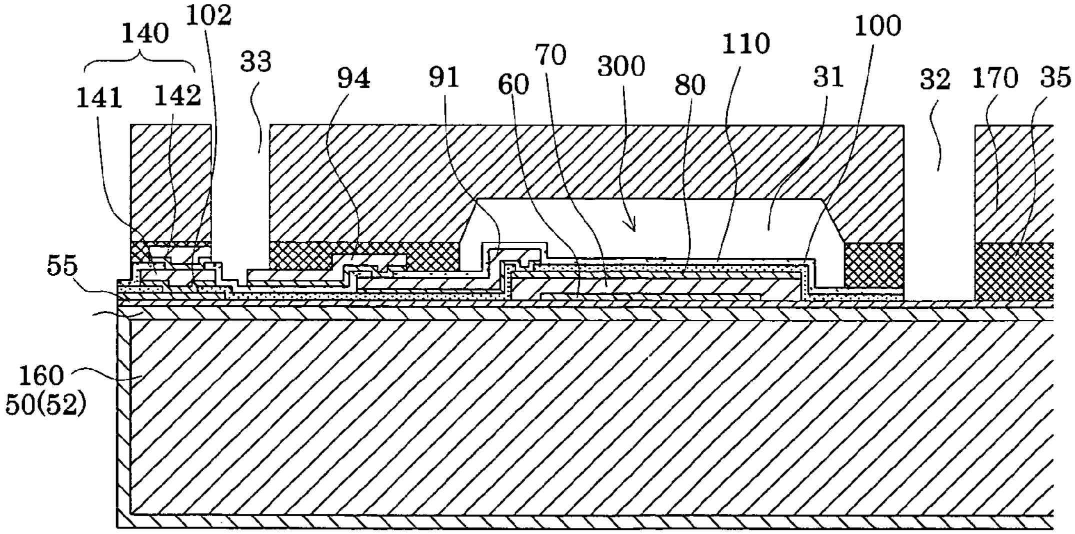

Then, as shown in FIG. 10C, a protective plate wafer 170, which is a silicon wafer and is to become a plurality of protective plates 30, is joined onto a surface of the passage-forming substrate wafer 160 where the piezoelectric elements 300 have been formed. The protective plate wafer 170 has a thickness, for example, of the order of 625 μm, and thus the rigidity of the passage-forming substrate wafer 160 is markedly increased by joining the protective plate wafer 170 thereto.

Figure 12A:
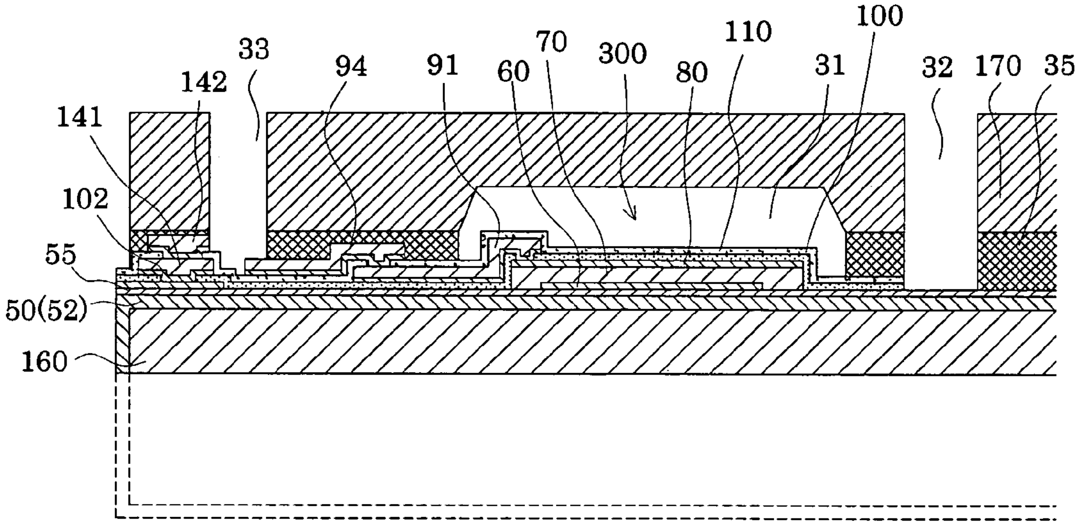
FIGS. 12A to 12C are sectional views showing the steps in the manufacturing process for the recording head according to Embodiment 1.
Figure 12B:
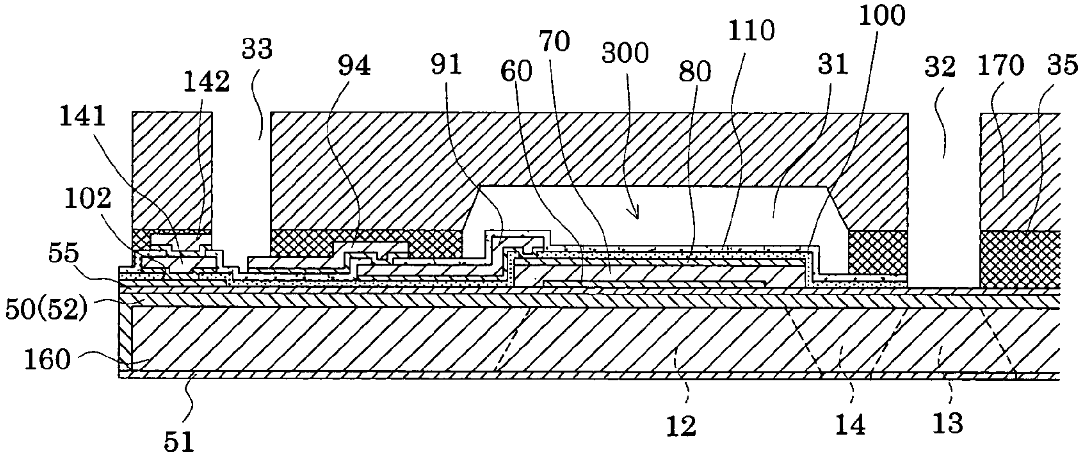
Figure 12C:
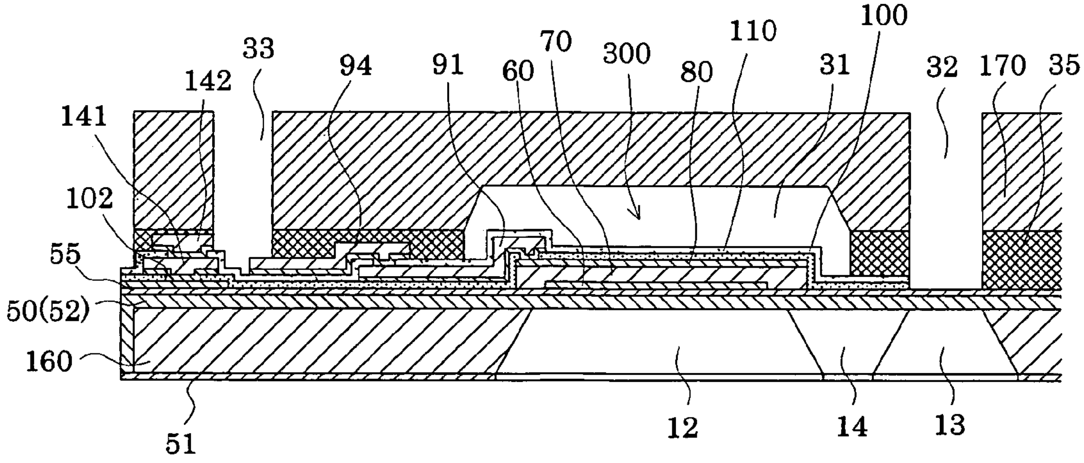

Then, as shown in FIG. 12A, the passage-forming substrate wafer 160 is polished to a certain thickness, and then is wet-etched with fluoronitric acid to bring the passage-forming substrate wafer 160 into a predetermined thickness. In the present embodiment, for example, the passage-forming substrate wafer 160 is processed to have a thickness of about 70 μm. Then, as shown in FIG. 12B, the mask film 51 comprising, for example, silicon nitride (SiN) is formed anew on the passage-forming substrate wafer 160, and is patterned into a predetermined shape. Then, the passage-forming substrate wafer 160 is subjected to anisotropic etching via the mask film 51 to form the pressure generating chambers 12, the communicating portion 13 and the ink supply paths 14 in the passage-forming substrate wafer 160 (FIG. 12C).

Then, unnecessary regions of the outer peripheral edge portions of the passage-forming substrate wafer 160 and the protective plate wafer 170 are removed, for example, by cutting by means of dicing. Then, the nozzle plate 20 having the nozzle orifices 21 bored therein is joined to the surface of the passage-forming substrate wafer 160 opposite the protective plate wafer 170, and the compliance plate 40 is joined to the protective plate wafer 170. The passage-forming substrate wafer 160 including the other members is divided into the passage-forming substrate 10, etc. of one-chip size as shown in FIG. 1 to produce the ink-jet recording head of the present embodiment.

Embodiment 2

Figure 13:
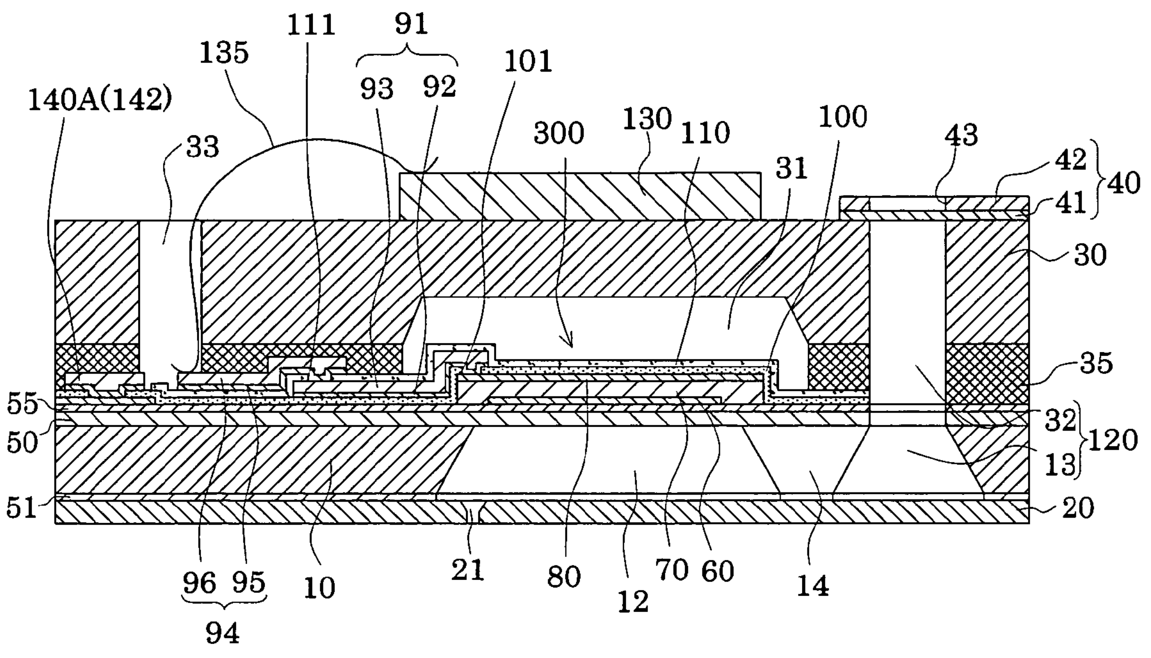
FIG. 13 is a sectional view of a recording head according to Embodiment 2.

FIG. 13 is a sectional view showing essential parts of an ink-jet recording head according to Embodiment 2, namely, a sectional view corresponding to one taken along line A-A' of FIG. 2A.

The present embodiment is a modification of the auxiliary electrode layer. The auxiliary electrode layer 140 according to Embodiment 1 is composed of a plurality of layers, specifically, the first conductive layer 141 and the second conductive layer 142. In the present embodiment, on the other hand, the auxiliary electrode layer is composed of a single layer. That is, the present embodiment is the same as Embodiment 1, except that an auxiliary electrode layer 140A is composed only of the second conductive layer 142 comprising the same layer as the second lead electrode 94, as shown in FIG. 13.

Even with the above feature, the same effects as in Embodiment 1 are objected. That is, since the resistance value of the lower electrode film 60 is substantially decreased, the occurrence of a drop in voltage can be prevented even when many of the piezoelectric elements 300 are simultaneously driven, as in Embodiment 1. Moreover, when the auxiliary electrode layer 140A (second conductive layer 142) is patterned, no stray current corrosion occurs between the lower electrode film 60 and the auxiliary electrode layer 140A, and the auxiliary electrode layer 140A can be formed satisfactorily.

In the present embodiment, the auxiliary electrode layer 140A is composed only of the second conductive layer 142, but it goes without saying that the auxiliary electrode layer 140A may be composed only of the first conductive layer 141 comprising the same layer as the first lead electrode. However, when the protective plate 30 is joined onto the passage-forming substrate 10 where the auxiliary electrode layer 140A is formed, the auxiliary electrode layer 140A is preferably formed from the second conductive layer 142 containing the metallic layer 96 comprising gold (Au). If the auxiliary electrode layer is formed only from the first conductive layer 141 containing the metallic layer 93 comprising, for example, aluminum (Al), the metallic layer 93 is likely to be fused by primer coating performed when joining the passage-forming substrate 10 and the protective plate 30.

Other Embodiments

Although the embodiments of the present invention have been described above, the present invention is not limited to these embodiments. In the above-described embodiments, for example, the formation of the auxiliary electrode layer composed of the one conductive layer or the two conductive layers (first and second conductive layers) on the lower electrode film is taken as an example. However, this is not limitative and, needless to say, the auxiliary electrode layer may be composed of three or more conductive layers.

Figure 14:
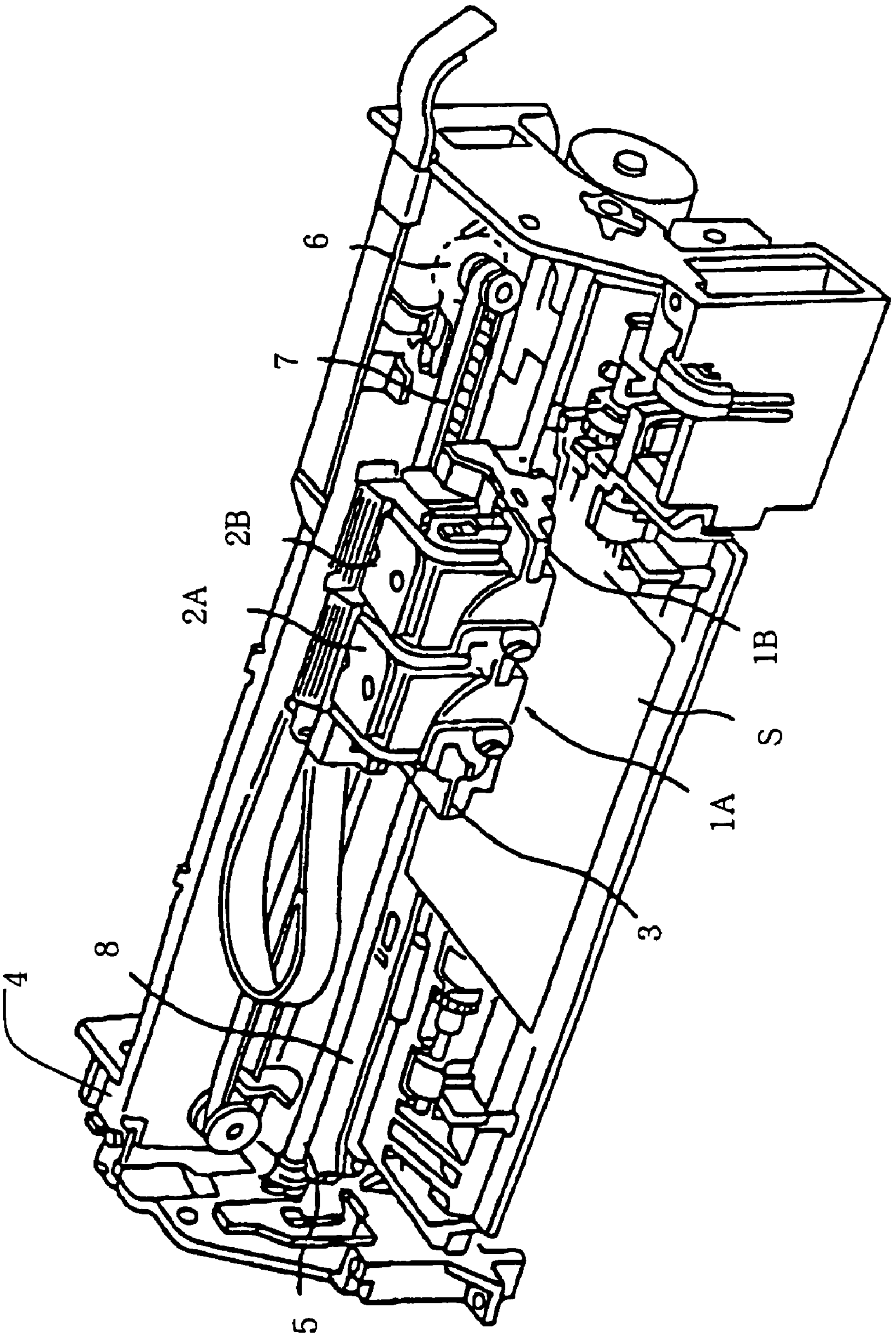
FIG. 14 is a schematic view of a recording apparatus according to an embodiment of the present invention.

The ink-jet recording head of the above-described embodiments is mounted on an ink-jet recording apparatus as a part of a recording head unit having ink passages communicating with an ink cartridge, etc. FIG. 14 is a schematic view showing an example of this ink-jet recording apparatus. As shown in FIG. 14, cartridges 2A and 2B constituting ink supply means are detachably provided in recording head units 1A and 1B having the ink-jet recording heads and a carriage 3 bearing the recording head units 1A and 1B is provided axially movably on a carriage shaft 5 mounted on an apparatus body 4. The recording head units 1A and 1B are to eject, for example, a black ink composition and a color ink composition, respectively. The drive force of a drive motor 6 is transmitted to the carriage 3 via a plurality of gears (not shown) and a timing belt 7, whereby the carriage 3 bearing the recording head units 1A and 1B is moved along the carriage shaft 5. The apparatus body 4 is provided with a platen 8 along the carriage shaft 5, and a recording sheet S as a recording medium, such as paper, which has been fed by a sheet feed roller or the like (not shown) is transported on the platen 8.

In the above-described embodiments, the ink-jet recording head is taken for illustration as an example of the liquid-jet head of the present invention. However, the basic configuration of the liquid-jet head is not limited to the above-described one. The present invention widely targets liquid-jet heads in general. Thus, needless to say, the present invention can be applied to liquid-jet heads for jetting liquids other than ink. Other liquid-jet heads include, for example, various recording heads for use in image recording devices such as printers, color material jet heads for use in the production of color filters such as liquid crystal displays, electrode material jet heads for use in the formation of electrodes for organic EL displays and FED (Field Emission Display), and bio-organic material jet heads for use in the production of biochips. It should be understood that such changes, substitutions and alterations can be made therein without departing from the spirit and scope of the invention as defined by the appended claims.

What is claimed is:

1. A liquid-jet head, comprising:

a passage-forming substrate in which pressure generating chambers communicating with nozzle orifices are formed;

piezoelectric elements provided on one surface side of the passage-forming substrate, and each comprising a lower electrode, a piezoelectric layer, and an upper electrode; and a lead-out electrode at least including a first lead electrode drawn from each of the piezoelectric elements, and wherein the lower electrode, which is a common electrode common to the plurality of piezoelectric elements, is continuously formed as far as a region outside a region opposite the piezoelectric elements, an auxiliary electrode layer is provided which comprises layers identical with layers constituting the lead-out electrode, and which is electrically connected to the lower electrode located outwardly of the region opposite the piezoelectric elements, a first insulation film covering the piezoelectric elements extends to a region where the auxiliary electrode layer is formed, in the first insulation film at least in a vicinity of an end portion of the passage-forming substrate in a direction parallel to the arrangement of the piezoelectric elements, a penetrated portion is provided in a region opposite the auxiliary electrode layer, and the auxiliary electrode layer is in contact with the lower electrode via the penetrated portion provided in the first insulation film.

2. The liquid-jet head according to claim 1, wherein the auxiliary electrode layer at least includes a first conductive layer comprising layers identical with those of the first lead electrode.

3. The liquid-jet head according to claim 2, wherein the lead-out electrode includes a second lead electrode drawn from the first lead electrode, the auxiliary electrode layer includes a second conductive layer comprising layers identical with those of the second lead electrode and provided on the first conductive layer via a second insulation film, the second insulation film has a penetrated portion provided at least in a vicinity of the end portion of the passage-forming substrate in the direction parallel to the arrangement of the piezoelectric elements, and the second conductive layer is in contact with the first conductive layer via the penetrated portion provided in the second insulation film.

4. The liquid-jet head according to claim 1, wherein the lead-out electrode includes the first lead electrode and the second lead electrode drawn from the first lead electrode, and the auxiliary electrode layer is composed of the second conductive layer comprising the layers identical with those of the second lead electrode.

5. The liquid-jet head according to claim 1, wherein the first insulation film is continuously provided in a region corresponding to the piezoelectric elements except junctions between the first lead electrodes and the piezoelectric elements.

6. The liquid-jet head according to claim 5, wherein the first insulation film comprises an inorganic insulation material.

7. The liquid-jet head according to claim 3, wherein the second insulation film is continuously provided in the region corresponding to the piezoelectric elements except junctions between the first lead electrodes and the second lead electrodes.

8. The liquid-jet head according to claim 7, wherein the second insulation film comprises an inorganic insulation material.

9. The liquid-jet head according to claim 6, wherein the inorganic insulation material is aluminum oxide.

10. The liquid-jet head according to claim 8, wherein the inorganic insulation material is aluminum oxide.

11. The liquid-jet head according to claim 1, further comprising a lower electrode. lead-out electrode drawn from the lower electrode between the piezoelectric elements adjacent to each other, the lower electrode lead-out electrode being connected to the auxiliary electrode layer.

12. A liquid-jet apparatus including the liquid-jet head according to claims 1.

13. A liquid-jet apparatus including the liquid-jet head according to claim 2.

14. A liquid-jet apparatus including the liquid-jet head according to claim 3.

15. A liquid-jet apparatus including the liquid-jet head according to claim 4.

16. A liquid-jet apparatus including the liquid-jet head according to claim 5.

17. A liquid-jet apparatus including the liquid-jet head according to claim 6.

18. A liquid-jet apparatus including the liquid-jet head according to claim 7.

19. A liquid-jet apparatus including the liquid-jet head according to claim 8.

20. A liquid-jet apparatus including the liquid-jet head according to claim 9.

21. A liquid-jet apparatus including the liquid-jet head according to claim 10.

22. A liquid-jet apparatus including the liquid-jet head according to claim 11.

* * * * *